(12) United States Patent
Huang et al.

(10) Patent No.: US 10,141,413 B2
(45) Date of Patent: *Nov. 27, 2018

(54) WAFER STRENGTH BY CONTROL OF UNIFORMITY OF EDGE BULK MICRO DEFECTS

(71) Applicant: Taiwan Semiconductor Manufacturing Co., Ltd., Hsin-Chu (TW)

(72) Inventors: I-Che Huang, Hsinchu (TW); Pu-Fang Chen, Hsinchu (TW); Ting-Chun Wang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 313 days.

This patent is subject to a terminal disclaimer.

(21) Appl. No.: 14/745,600

(22) Filed: Jun. 22, 2015

(65) Prior Publication Data

US 2015/0357421 A1    Dec. 10, 2015

Related U.S. Application Data

(63) Continuation-in-part of application No. 13/889,515, filed on May 8, 2013, now Pat. No. 9,064,823.

(Continued)

(51) Int. Cl.
*H01L 31/0232* (2014.01)
*H01L 29/32* (2006.01)
(Continued)

(52) U.S. Cl.
CPC .......... *H01L 29/32* (2013.01); *H01L 21/324* (2013.01); *H01L 21/3225* (2013.01);
(Continued)

(58) Field of Classification Search
CPC ... H01L 29/32; H01L 21/3225; H01L 21/324; H01L 21/67098; H01L 21/67288;
(Continued)

(56) References Cited

U.S. PATENT DOCUMENTS

| 4,342,616 A | 8/1982 | Elliott et al. |
| 6,040,211 A | 3/2000 | Schrems |

(Continued)

FOREIGN PATENT DOCUMENTS

| KR | 1020080017205 | 2/2008 |
| KR | 20120004925 A | 1/2012 |

OTHER PUBLICATIONS

Non-Final Office Action dated Oct. 2, 2014 for U.S. Appl. No. 13/889,515.

(Continued)

*Primary Examiner* — Long K Tran
(74) *Attorney, Agent, or Firm* — Eschweiler & Potashnik, LLC (57) ABSTRACT

Some embodiments relate to a silicon wafer having a disc-like silicon body. The wafer includes a central portion circumscribed by a circumferential edge region. A plurality of sampling locations, which are arranged in the circumferential edge region, have a plurality of wafer property values, respectively, which correspond to a wafer property. The plurality of wafer property values differ from one another according to a pre-determined statistical edge region profile.

20 Claims, 4 Drawing Sheets

Related U.S. Application Data (60) Provisional application No. 61/778,774, filed on Mar. 13, 2013.

(51) Int. Cl.
| | |
|---|---|
| *H01L 29/16* | (2006.01) |
| *H01L 21/67* | (2006.01) |
| *H01L 21/66* | (2006.01) |
| *H01L 21/322* | (2006.01) |
| *H01L 21/324* | (2006.01) |
| *C30B 29/06* | (2006.01) |

(52) U.S. Cl.
CPC .. *H01L 21/67098* (2013.01); *H01L 21/67288* (2013.01); *H01L 22/12* (2013.01); *H01L 29/16* (2013.01); *C30B 29/06* (2013.01); *H01L 2924/0002* (2013.01)

(58) Field of Classification Search
CPC . H01L 2924/0002; H01L 22/12; H01L 29/16; C30B 29/06
USPC .......................................................... 702/82
See application file for complete search history.

(56) References Cited

U.S. PATENT DOCUMENTS

| | | | |
|---|---|---|---|
| 6,048,395 A | 4/2000 | Lida et al. | |
| 6,120,599 A | 9/2000 | Lida et al. | |
| 6,348,180 B1 | 2/2002 | Lida et al. | |
| 6,569,535 B2 | 5/2003 | Murakami et al. | |
| 6,709,721 B2 | 3/2004 | Rocha-Alvarez et al. | |
| 6,893,499 B2 | 5/2005 | Fusegawa et al. | |
| 6,905,800 B1 | 6/2005 | Yuen et al. | |
| 7,192,790 B2 | 3/2007 | Ishil et al. | |
| 7,203,559 B2 | 4/2007 | Ito et al. | |
| 7,205,161 B2 | 4/2007 | Klaerner et al. | |
| 7,217,320 B2 | 5/2007 | Kim et al. | |
| 7,320,731 B2 * | 1/2008 | Ono ................ | C30B 15/203 117/13 |
| 7,394,129 B2 | 7/2008 | Graf et al. | |
| 7,397,110 B2 | 7/2008 | Takase et al. | |
| 7,404,856 B2 | 7/2008 | Haga et al. | |
| 7,442,253 B2 | 10/2008 | Falster et al. | |
| 7,503,975 B2 | 3/2009 | Yamazaki et al. | |
| 7,700,394 B2 | 4/2010 | Sadamitsu et al. | |
| 7,718,926 B2 | 5/2010 | Matsuzawa et al. | |
| 7,828,893 B2 | 11/2010 | Mueller et al. | |
| 7,928,317 B2 | 4/2011 | Atanackovic | |
| 7,964,275 B2 | 6/2011 | Mueller et al. | |
| 7,998,845 B2 | 8/2011 | Kasahara et al. | |
| 8,197,594 B2 | 6/2012 | Nakai et al. | |
| 8,334,170 B2 | 12/2012 | Wang et al. | |
| 8,343,618 B2 | 1/2013 | Fukuda et al. | |
| 8,387,674 B2 | 3/2013 | Yu et al. | |
| 8,411,263 B2 | 4/2013 | Uchino et al. | |
| 8,586,452 B2 | 11/2013 | Lochtefeld et al. | |
| 8,673,248 B2 | 3/2014 | Kulkarni et al. | |
| 9,064,823 B2 * | 6/2015 | Huang ................ | H01L 21/324 |
| 2006/0046431 A1 | 3/2006 | Blietz et al. | |
| 2007/0017436 A1 * | 1/2007 | Ono ...................... | C30B 15/203 117/20 |
| 2007/0035322 A1 | 2/2007 | Kang et al. | |
| 2008/0113171 A1 | 5/2008 | Nakai et al. | |
| 2009/0038669 A1 | 2/2009 | Atanackovic | |
| 2009/0242843 A1 | 10/2009 | Ebara | |
| 2012/0007978 A1 | 1/2012 | Passek et al. | |
| 2012/0168911 A1 | 7/2012 | Chen et al. | |
| 2012/0172648 A1 * | 7/2012 | Seebauer ............... | B82Y 30/00 585/733 |
| 2012/0235283 A1 | 9/2012 | Libbert et al. | |
| 2012/0301976 A1 | 11/2012 | Kuwabara | |
| 2013/0078588 A1 | 3/2013 | Senda et al. | |
| 2013/0186178 A1 | 7/2013 | Usagawa | |
| 2013/0187249 A1 | 7/2013 | Cooney et al. | |
| 2013/0229638 A1 | 9/2013 | Chen et al. | |
| 2013/0323153 A1 * | 12/2013 | Hoshi .................... | G01N 21/47 423/348 |
| 2014/0042715 A1 | 2/2014 | Hsu et al. | |
| 2014/0044945 A1 | 2/2014 | Mueller et al. | |
| 2015/0147258 A1 * | 5/2015 | Hong ..................... | C30B 15/00 423/348 |

OTHER PUBLICATIONS

Notice of Allowance dated Feb. 17, 2015 for U.S. Appl. No. 13/889,515.

Su, Garth K. "Controlling Discocations and Bulk Microdefects on Fabricated Wafers to Prevent Device Leakage." Micromagazine. com. Jun. 8, 2015.

Su, et al. "Effects of Dislocation and Bulk Micro Defects on Device Leakage." Semicon, Taiwan 2001.

* cited by examiner

WAFER STRENGTH BY CONTROL OF UNIFORMITY OF EDGE BULK MICRO DEFECTS

REFERENCE TO RELATED APPLICATIONS

This application is a continuation-in-part of U.S. application Ser. No. 13/889,515 filed on May 8, 2013, which claims priority to U.S. Provisional Application No. 61/778,774 filed on Mar. 13, 2013, the contents of which are incorporated by reference in their entirety.

BACKGROUND

In semiconductor manufacturing, semiconductor wafers often undergo many processing steps or stages before a completed die is formed. For example, thermal processing is often performed on wafers for various purposes, such as Shallow Trench Isolation (STI), repairing film defects, dopant activation from ion implantations, and film property transformation, among others.

Bulk Micro Defects (BMDs) may be further induced by thermal processing, as proven useful in semiconductor processing for metal contamination gathering effects. Although BMDs may provide the advantageous metal gathering effect, the thermal processing associated with the formation of the BMDs also has a tendency to reduce wafer strength, which can lead to undesirable wafer distortion (warping), substrate lattice dislocation, and/or broken wafers which lead to failures of the wafer and lower yields of final products.

Conventional methods for maintaining wafer strength have been primarily limited to controlling an overall oxygen concentration and crystalline defect densities across an entire semiconductor ingot during the ingot preparation process.

DETAILED DESCRIPTION

The present disclosure provides a method for qualifying a semiconductor wafer for subsequent processing, such as thermal processing. Accordingly, the description is made with reference to the drawings, in which like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

In semiconductor manufacturing, bulk micro defects (BMDs) have been evidenced in semiconductor wafers and/or semiconductor ingots, and have been advantageously utilized to provide metal contamination gathering effects. Although BMDs may provide the advantageous metal gathering effect, the thermal processing associated with the formation of the BMDs also has a tendency to reduce wafer strength, which can lead to undesirable wafer distortion (warping), substrate lattice dislocation, and/or broken wafers which lead to failures of the wafer and lower yields of final products. In some instances, the semiconductor wafer comprises Czochralski (CZ) and float-zone (FZ) crystals formed therein, which can further reduce wafer strength due to additional crystal defects imposed in the wafer.

Heretofore, examination of BMDs in a semiconductor workpiece have not taken into consideration the distribution of BMDs in an edge or periphery of the semiconductor wafer. The present disclosure finds a new appreciation that the BMD distribution in the wafer edge affects stresses in the wafer during subsequent thermal processing. Accordingly, an analysis of the edge of the semiconductor wafer can advantageously predict subsequent failures and maintain adequate metal ion gathering abilities of the wafer. Thus, the analysis of the present disclosure can be utilized to qualify wafers for subsequent processing, wherein losses due to breakage and/or performance can be minimized.

Figure 1:
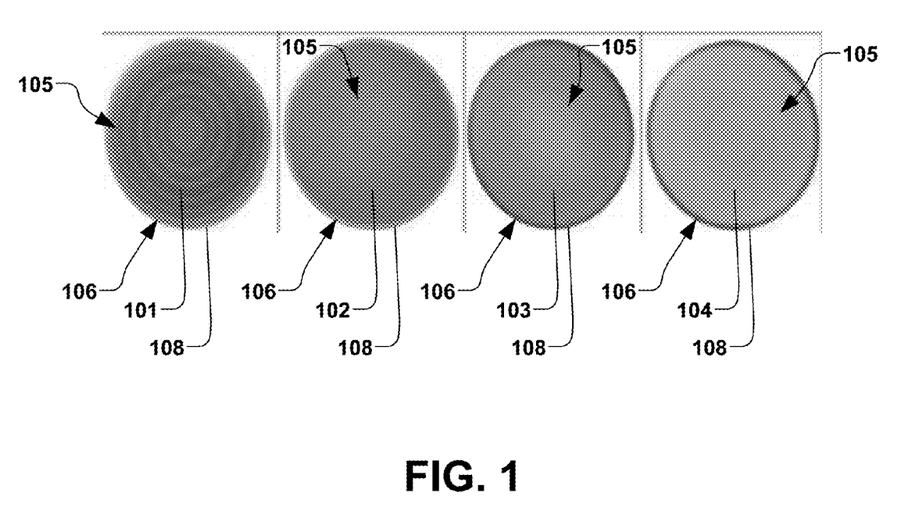
FIG. 1 illustrates four semiconductor wafers having differing edge bulk micro defects in accordance with one aspect.

Referring now to FIG. 1, a first semiconductor wafer 101, second semiconductor wafer 102, third semiconductor wafer 103, and fourth semiconductor wafer 104 are illustrated, wherein each of the first, second, third, and fourth semiconductor wafers originate from different lots and/or wafer manufacturers. The first semiconductor wafer 101, second semiconductor wafer 102, third semiconductor wafer 103, and fourth semiconductor wafer 104 are generally referred to a semiconductor wafer 105. The present disclosure particularly addresses a periphery 106 of the semiconductor wafer 105, wherein the periphery, in one example, comprises a region extending inwardly (e.g. approximately 10 mm) from an outermost edge 108 of the wafer.

Figure 2:
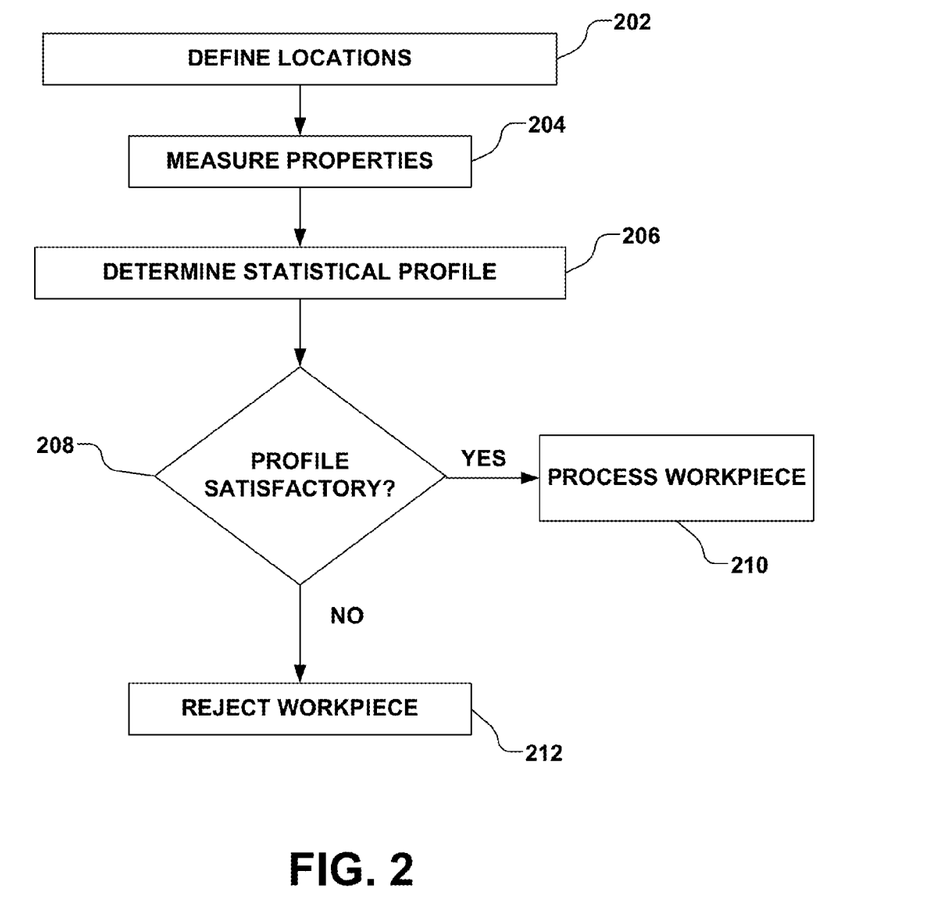
FIG. 2 illustrates a methodology for qualifying a workpiece in accordance with another aspect.

Referring now to FIG. 2, a method 200 for qualifying a semiconductor wafer for subsequent processing is provided. The method 200, for example, comprises defining a plurality of locations about the periphery of the semiconductor wafer in act 202. For example, ten or more locations within approximately 10 mm from the outermost edge 108 of the semiconductor wafer 105 of FIG. 1 are defined in act 202 of FIG. 2.

In act 204, one or more properties of the semiconductor wafer are measured at each of the plurality of locations. The one or more properties, for example, comprise one or more of an oxygen concentration and a density of bulk micro defects present at each of the plurality of locations. Measuring the one or more properties of the semiconductor wafer, for example, comprises analyzing the semiconductor wafer 105 of FIG. 1 with one or more of a microscope and x-ray.

In act 206, a statistical profile associated with the periphery of the semiconductor wafer is determined, wherein the statistical profile is based on the one or more properties measured at the plurality of locations. The statistical profile determined in act 206 for example, comprises dividing a difference between a maximum and a minimum of the respective one or more properties measured at the plurality of locations by a statistical mean of the respective one or more properties at the plurality of locations. For example, a minimum measured density of BMDs is subtracted from a maximum measured density of BMDs from the measurement of act 204, and the difference is divided by a statistical mean of the plurality of measured densities of BMDs, thus yielding the statistical profile associated with the periphery of the semiconductor wafer.

In act 208, a determination is made as to whether the statistical profile garnered in act 206 is acceptable. For example, if the statistical profile falls within a predetermined range, the semiconductor wafer is sent for subsequent processing, such as thermal treatment or other processing in act 210. If the statistical profile deviates or does not fall within the predetermined range, the semiconductor wafer is rejected from subsequent processing in act 212, thereby mitigating potential defects such as warpage, breakage, or other wafer distortion. The predetermined range, for example, comprises a statistical profile for BDMs ranging between zero and one. In other examples, the one or more properties measured in act 204 comprise the oxygen concentration. As such, the predetermined range of the statistical profile, for example, can comprise an oxygen concentration ranging between approximately 9.5 parts per million atoms and approximately 11.5 parts per million atoms.

Figure 3:
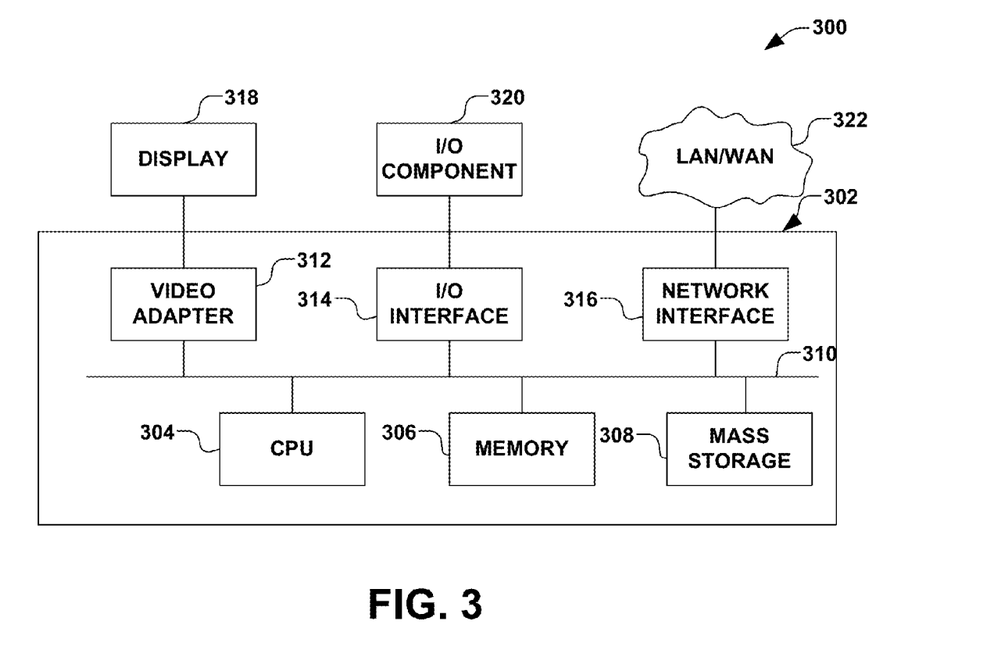
FIG. 3 illustrates a schematic representation of a processor-based system for qualifying a wafer in accordance with various aspects.

In accordance with another aspect, the aforementioned methodology may be implemented using computer program code in one or more general purpose computer or processor based system. As illustrated in FIG. 3, a block diagram is provided of a processor based system 300 in accordance with another embodiment. The processor based system 300 is a general purpose computer platform and may be used to implement processes discussed herein. The processor based system 300 may include a processing unit 302, such as a desktop computer, a workstation, a laptop computer, or a dedicated unit customized for a particular application. The processor based system 300 may be equipped with a display 318 and one or more input/output devices 320, such as a mouse, a keyboard, or printer. The processing unit 302 may include a central processing unit (CPU) 304, memory 306, a mass storage device 308, a video adapter 312, and an I/O interface 314 connected to a bus 310.

The bus 310 may be one or more of any type of several bus architectures including a memory bus or memory controller, a peripheral bus, or video bus. The CPU 304 may include any type of electronic data processor, and the memory 306 may include any type of system memory, such as static random access memory (SRAM), dynamic random access memory (DRAM), or read-only memory (ROM).

The mass storage device 308 may include any type of storage device configured to store data, programs, and other information and to make the data, programs, and other information accessible via the bus 310. The mass storage device 308 may include, for example, one or more of a hard disk drive, a magnetic disk drive, or an optical disk drive.

The video adapter 312 and the I/O interface 314 provide interfaces to couple external input and output devices to the processing unit 302. Examples of input and output devices include the display 318 coupled to the video adapter 312 and the I/O device 320, such as a mouse, keyboard, printer, and the like, coupled to the I/O interface 314. Other devices may be coupled to the processing unit 302, and additional or fewer interface cards may be utilized. For example, a serial interface card (not shown) may be used to provide a serial interface for a printer. The processing unit 302 also may include a network interface 316 that may be a wired link to a local area network (LAN) or a wide area network (WAN) 322 and/or a wireless link.

It should be noted that the processor based system 300 may include other components. For example, the processor based system 300 may include power supplies, cables, a motherboard, removable storage media, cases, and the like. These other components, although not shown, are considered part of the processor based system 300.

Embodiments of the present disclosure may be implemented on the processor based system 300, such as by program code executed by the CPU 304. Various methods according to the above-described embodiments may be implemented by program code. Accordingly, explicit discussion herein is omitted.

Further, it should be noted that the modules and devices in FIG. 1 may all be implemented on one or more processor based systems 300 of FIG. 3. Communication between the different modules and devices may vary depending upon how the modules are implemented. If the modules are implemented on one processor based system 300, data may be saved in memory 306 or mass storage 308 between the execution of program code for different steps by the CPU 304. The data may then be provided by the CPU 304 accessing the memory 306 or mass storage 308 via bus 310 during the execution of a respective step. If modules are implemented on different processor based systems 300 or if data is to be provided from another storage system, such as a separate database, data can be provided between the systems 300 through I/O interface 314 or network interface 316. Similarly, data provided by the devices or stages may be input into one or more processor based system 300 by the I/O interface 314 or network interface 316. A person having ordinary skill in the art will readily understand other variations and modifications in implementing systems and methods that are contemplated within the scope of varying embodiments.

Figure 4A:
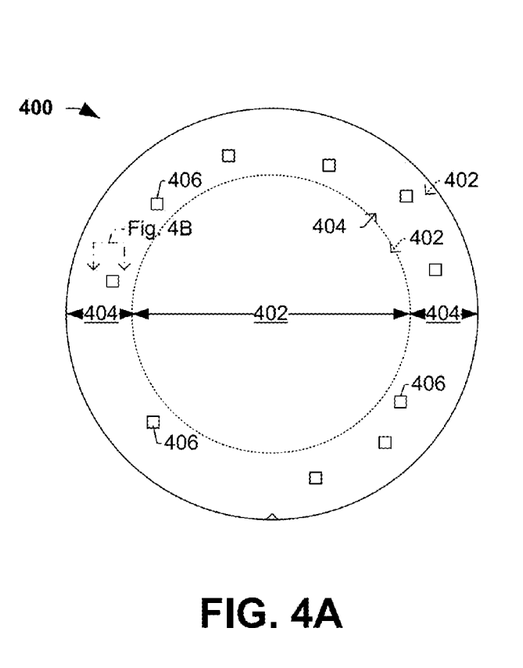
FIGS. 4A-4B illustrate a top view and cross-sectional view of a wafer in accordance with some embodiments.
Figure 4B:
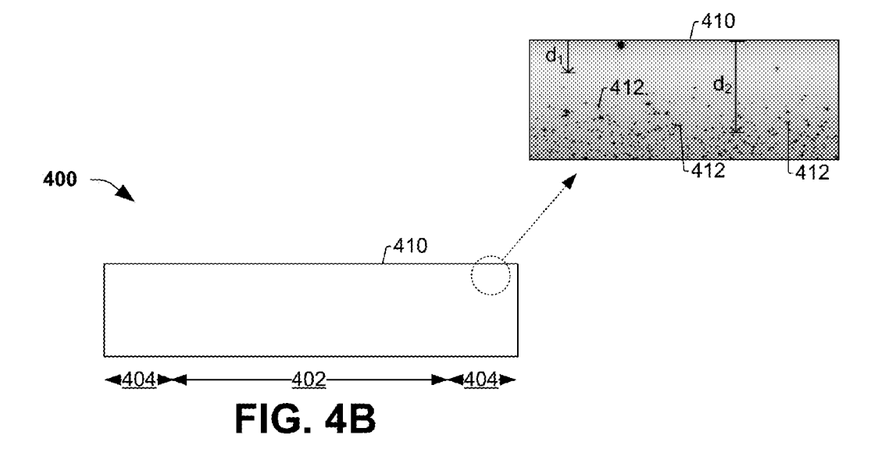

FIGS. 4A and 4B illustrate a top view and cross-sectional view, respectively, of a silicon wafer 400 in accordance with some embodiments. The silicon wafer 400 includes a disc-like silicon body comprising a central portion 402 circumscribed by a circumferential edge region 404. A number of sampling locations 406 are typically arranged in the circumferential edge region 404. During manufacturing, wafer property values are measured at these respective sampling locations 406. The wafer property values can relate to a wafer property, such as an intrinsic oxygen concentration or a BMD concentration for example, at the respective sampling locations. Because the wafer 400 can be pre-sorted according to the methodologies previously described, the plurality of wafer property values for the wafer 400 differ from one another according to a pre-determined statistical edge region profile. Other wafers in moving through the fab also have the same pre-determined statistical edge region profile.

In some embodiments, the wafer property of wafer 400 is a BMD concentration. In these embodiments, BMD concentrations at the respective sampling locations 406 can differ from one another according to a pre-determined statistical BMD edge region profile. In some cases, the pre-determined statistical BMD edge region profile is met if a maximum BMD concentration (which corresponds to one of the plurality of locations) minus a minimum BMD concentration (which corresponds to another of the plurality of locations) provides a difference. This difference divided by a mean of the plurality of BMD concentrations for the sampling locations is less than one. For example, consider a case where BMD concentrations are measured for 5 sampling locations, and the BMD concentrations at these 5 sampling locations are ($3.1*10^9$ cm$^{-3}$; $3.2*10^9$ cm$^{-3}$; $2*10^9$ cm$^{-3}$; $2.7*10^9$ cm$^{-3}$; and $3.3*10^9$ cm$^{-3}$). The maximum BMD concentration in this case would be $3.2*10^9$ cm$^-$3, and the minimum BMD concentration in this case would be $2*10^9$, such that the difference would be $1.2*10^9$ cm$^{-3}$. With the mean being 2.86 cm$^{-3}$, the difference (1.2*10$^9$ cm$^-$3) divided by the mean (2.86 cm$^{-3}$) is less than 1, and so the pre-determined statistical BMC edge region profile would be met. Thus, because the pre-determined statistical profile is met, the wafer exhibits improved resistance to distortion, warpage, and breakage.

In some embodiments, the wafer property is a bulk micro defect (BMD) concentration and the wafer property values measured at the respective sampling locations range between 1*10$^8$ cm$^{-3}$ and 6*10$^9$ cm$^{-3}$. In some embodiments, the BMD concentration can range between 5*10$^8$ cm$^{-3}$ and 3*10$^9$ cm$^{-3}$, or can be about 1.2*10$^9$ cm$^{-3}$.

In other embodiments, the wafer property is an intrinsic oxygen concentration (Oi). In some of these embodiments, the wafer property values for the respective sampling locations range between 9.5 parts per million atomic (ppma) and 11.5 ppma; or between 10 ppma and 11.5 pppm; or can be about 10.6 ppma.

FIG. 4B shows an inset cross-sectional view illustrating BMDs 412 as seen into a depth of the wafer 400 (i.e., measure from a face 410 of the wafer 400). As illustrated, the wafer 400 can exhibit a surface BMD concentration at a first distance, $d_1$, from the wafer face 410. The wafer can also exhibit a buried BMD concentration at a second distance, $d_2$, from the wafer face 410. The buried BMD concentration is greater than the surface BMD concentration, often by an order of magnitude or more, when $d_1$ is less than 50 μm and $d_2$ is 100 μm or greater.

Silicon wafers in accordance with some embodiments can include a bulk silicon wafer or a semiconductor-on-insulator (SOI) wafer (e.g., silicon on insulator wafer). Silicon wafers can also include binary semiconductor material (e.g., GaAs), a tertiary semiconductor material (e.g., AlGaAs), or a higher order semiconductor material, for example. In many instances, wafers can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); 450 mm (17.7 inch, usually referred to as "18 inch"); for example. Wafers that are 300 mm or larger are particularly prone to breakage/warpage, and the present disclosure is particularly advantageous for these sizes of wafers.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

While the method(s) provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

It will be appreciated that while reference is made throughout this document to exemplary structures in discussing aspects of methodologies described herein, that those methodologies are not to be limited by the corresponding structures presented. Rather, the methodologies (and structures) are to be considered independent of one another and able to stand alone and be practiced without regard to any of the particular aspects depicted in the Figs.

Some embodiments relate to a silicon wafer having a disc-like silicon body. The wafer includes a central portion circumscribed by a circumferential edge region. A plurality of sampling locations, which are arranged in the circumferential edge region, have a plurality of wafer property values, respectively, which correspond to a wafer property. The plurality of wafer property values differ from one another according to a pre-determined statistical edge region profile.

Other embodiments relate to a silicon wafer including a disc-like silicon body. The wafer has an intrinsic oxygen concentration (Oi) ranging between 9.5 parts per million atomic (ppma) and 11.5 ppma.

Still other embodiments relate to a system. The system includes a semiconductor wafer property measuring element configured to measure an oxygen concentration or bulk micro defect profile at a plurality of locations on a semiconductor wafer. A processing unit is configured to determine a statistical profile associated with the semiconductor wafer based on the oxygen concentration or bulk micro defect profile measured at the plurality of locations. The processing unit is further configured to qualify the semiconductor wafer for subsequent processing when the statistical profile falls within a predetermined range and to reject the semiconductor wafer from subsequent processing when the statistical profile deviates from the predetermined range.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A method for processing a disk-shaped semiconductor wafer, the method comprising:
   receiving a disk-shaped semiconductor wafer;
   providing the disk-shaped semiconductor wafer to a semiconductor manufacturing system, wherein the semiconductor manufacturing system comprises a plurality of successive semiconductor processing steps configured to form an integrated circuit (IC), and wherein one of the successive semiconductor processing steps comprises a thermal process;

initiating a scanning electron microscope to measure an oxygen concentration or a density of bulk micro defects (BMDs) at a plurality of locations in a peripheral region of the disk-shaped semiconductor wafer extending about ten millimeters inwardly from an outermost edge of the disk-shaped semiconductor wafer;

subtracting a minimum measured oxygen concentration or minimum measured BMD from a maximum measured oxygen concentration or maximum measured BMD, respectively, to determine a max/min difference;

dividing the max/min difference by an average of the measured oxygen concentrations or average of the measured BMDs, respectively, to determine a threshold value of the disk-shaped semiconductor wafer;

if the threshold value of the disk-shaped semiconductor wafer is outside a predetermined range comprising a statistical profile of oxygen concentration ranging between approximately 9.5 parts per million atomic and approximately 11.5 parts per million atomic, removing the disk-shaped semiconductor wafer from the semiconductor manufacturing system such that the disk-shaped semiconductor wafer is prevented from undergoing the thermal process; and if the threshold value of the disk-shaped semiconductor wafer is inside the predetermined range comprising the statistical profile of oxygen concentration, forming the IC on the disk-shaped semiconductor wafer in the semiconductor manufacturing system, wherein forming the IC comprises the disk-shaped semiconductor wafer undergoing the thermal process.

2. The method of claim 1, wherein the disk-shaped semiconductor wafer comprises a doped silicon wafer.

3. The method of claim 1, wherein the disk-shaped semiconductor wafer comprises Czochralski (CZ) and float-zone (FZ) crystals formed therein.

4. The method of claim 1, wherein a processing unit receives the measured oxygen concentration or the measured density of BMDs, generates the max/min difference, and generates the threshold value.

5. The method of claim 4, wherein removing the disk-shaped semiconductor wafer from the semiconductor manufacturing system is to prevent adverse overlay effects from reducing a yield of ICs on the disk-shaped semiconductor wafer.

6. The method of claim 5, wherein removing the disk-shaped semiconductor wafer from the semiconductor manufacturing system comprises a physical device configured to remove the disk-shaped semiconductor from the semiconductor manufacturing system.

7. The method of claim 1, wherein the predetermined range is a value between 0 and 1.

8. A method for processing a disk-shaped semiconductor wafer, the method comprising:

providing a disk-shaped semiconductor wafer to a semiconductor manufacturing system, wherein the semiconductor manufacturing system comprises a scanning electron microscope and a thermal processing chamber;

initiating the scanning electron microscope to measure an oxygen concentration or a density of bulk micro defects (BMDs) at a plurality of locations closely adjacent to an outermost edge of the disk-shaped semiconductor wafer, wherein the plurality of locations closely adjacent to the outermost edge of the disk-shaped semiconductor wafer are disposed within about 10mm of the outermost edge of the disk-shaped semiconductor wafer;

generating a max/min difference by calculating a difference between a lowest measured oxygen concentration or lowest measured BMD and a greatest measured oxygen concentration or greatest measured BMD, respectively;

generating a threshold value of the disk-shaped semiconductor wafer by dividing the max/min difference by an average of the measured oxygen concentration or average of the measured DMDs, respectively;

if the threshold value of the disk-shaped semiconductor is outside a predetermined range comprising a statistical profile of oxygen concentration ranging between approximately 9.5 parts per million atomic and approximately 11.5 parts per million atomic, removing the disk-shaped semiconductor wafer from the semiconductor manufacturing system such that the disk-shaped semiconductor wafer does not enter the thermal processing chamber; and if the threshold value of the disk-shaped semiconductor is inside the predetermined range comprising the statistical profile of oxygen concentration, forming an integrated circuit (IC) on the disk-shaped semiconductor wafer, wherein forming the IC comprises advancing the disk-shaped semiconductor wafer through the semiconductor manufacturing system such that the disk-shaped semiconductor wafer enters the thermal processing chamber.

9. The method of claim 8, wherein a processing unit receives the measured oxygen concentration or the measured density of BMDs, generates the max/min difference, and generates the threshold value.

10. The method of claim 9, wherein the disk-shaped semiconductor wafer comprises a doped silicon wafer or a semiconductor-on-insulator (SOI).

11. The method of claim 10, wherein the semiconductor wafer comprises Czochralski (CZ) and float-zone (FZ) crystals formed therein.

12. The method of claim 11, wherein removing the disk-shaped semiconductor wafer from the semiconductor manufacturing system is to prevent adverse overlay effects from reducing a yield of ICs on the disk-shaped semiconductor wafer.

13. A method for processing a disk-shaped semiconductor wafer, the method comprising:

providing a disk-shaped semiconductor wafer to a semiconductor manufacturing system, wherein the semiconductor manufacturing system comprises a scanning electron microscope and a thermal processing chamber;

initiating the scanning electron microscope to measure an oxygen concentration or a density of bulk micro defects (BMDs) at a plurality of locations closely adjacent to an outermost edge of the disk-shaped semiconductor wafer, wherein the plurality of locations closely adjacent to the outermost edge of the disk-shaped semiconductor wafer are disposed within about 10mm of the outermost edge of the disk-shaped semiconductor wafer;

generating a threshold value of the disk-shaped semiconductor wafer by determining a statistical profile associated with the measured oxygen concentration or the measured density of BMDs;

if the threshold value of the disk-shaped semiconductor is outside a predetermined range, removing the disk-shaped semiconductor wafer from the semiconductor manufacturing system to limit adverse overlay effects; and if the threshold value of the disk-shaped semiconductor is within the predetermined range, forming an integrated circuit (IC) on the disk-shaped semiconductor wafer, wherein the predetermined range comprises a statistical profile of oxygen concentration ranging between approximately 9.5 parts per million atomic and approximately 11.5 parts per million atomic.

14. The method of claim 13, wherein a processing unit receives the measured oxygen concentration or the measured density of BMDs and generates the statistical profile.

15. The method of claim 13, wherein forming the IC comprises advancing the disk-shaped semiconductor wafer through the semiconductor manufacturing system such that the disk-shaped semiconductor wafer enters the thermal processing chamber, and wherein the adverse overlay effects are caused by the disk-shaped semiconductor wafer undergoing a thermal processing step in the thermal processing chamber.

16. The method of claim 13, wherein the statistical profile is calculated by:
    subtracting a lowest measured oxygen concentration or lowest measured BMD from a greatest measured oxygen concentration or greatest measured BMD, respectively, to generate a max/min value; and
    dividing the max/min value by an average of the measured oxygen concentration or average of the measured BMDs, respectively.

17. The method of claim 16, wherein the predetermined range is a value between 0 and 1.

18. The method of claim 13, wherein the disk-shaped semiconductor wafer comprises a doped silicon wafer or a semiconductor-on-insulator (SOI).

19. The method of claim 13, wherein removing the disk-shaped semiconductor wafer from the semiconductor manufacturing system comprises a physical device configured to remove the disk-shaped semiconductor from the semiconductor manufacturing system.

20. The method of claim 13, wherein the predetermined range is a value between 0and 1.

* * * * *